US012205937B2

(12) United States Patent
Kim et al.

(10) Patent No.: US 12,205,937 B2
(45) Date of Patent: Jan. 21, 2025

(54) DISPLAY DEVICE

(71) Applicant: LG ELECTRONICS INC., Seoul (KR)

(72) Inventors: Taehoon Kim, Seoul (KR); Sangyeol Kim, Seoul (KR); Dongho Ham, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 467 days.

(21) Appl. No.: 17/596,497

(22) PCT Filed: Jun. 11, 2019

(86) PCT No.: PCT/KR2019/007001
§ 371 (c)(1),
(2) Date: Dec. 10, 2021

(87) PCT Pub. No.: WO2020/251071
PCT Pub. Date: Dec. 17, 2020

(65) Prior Publication Data
US 2022/0310574 A1 Sep. 29, 2022

(51) Int. Cl.
*H10K 59/131* (2023.01)
*G09G 3/32* (2016.01)
(Continued)

(52) U.S. Cl.
CPC ............. *H01L 25/167* (2013.01); *G09G 3/32* (2013.01); *G09G 3/3233* (2013.01); *H01L 24/02* (2013.01);
(Continued)

(58) Field of Classification Search
CPC ....................... H10K 59/90–95; G09G 3/3266
See application file for complete search history.

(56) References Cited

U.S. PATENT DOCUMENTS

| 2006/0066236 A1* | 3/2006 | Tanaka | H10K 59/179 313/511 |
| 2019/0267432 A1* | 8/2019 | Li | H10K 71/00 |
| 2021/0159461 A1* | 5/2021 | Nakamura | G09F 9/46 |

FOREIGN PATENT DOCUMENTS

| KR | 1020120122227 | 11/2012 |
| KR | 1020130141097 | 12/2013 |

(Continued)

OTHER PUBLICATIONS

PCT International Application No. PCT/KR2019/007001, International Search Report dated Mar. 10, 2020, 5 pages.

*Primary Examiner* — Evan G Clinton
(74) *Attorney, Agent, or Firm* — LEE, HONG, DEGERMAN, KANG & WAIMEY

(57) ABSTRACT

A display device is disclosed. According to one aspect of the present invention, provided is a display device comprising a display panel having a first display area and a second display area on the outside of the first display area, wherein the display panel comprises: a first substrate which includes a main pixel unit disposed in the first display area and having main pixels, and a GIP unit disposed in the second display area and generating a gate signal; and a second substrate which is bonded to the first substrate and includes an auxiliary pixel unit disposed in the second display area and having auxiliary pixels, the GIP unit supplying the gate signal to the main pixels and the auxiliary pixels.

17 Claims, 11 Drawing Sheets

(51) Int. Cl.
*G09G 3/3233* (2016.01)
*H01L 23/00* (2006.01)
*H01L 25/16* (2023.01)
*H01L 25/18* (2023.01)
*G09G 3/3266* (2016.01)

(52) U.S. Cl.
CPC .............. *H01L 24/05* (2013.01); *H01L 24/08* (2013.01); *H01L 25/18* (2013.01); *H10K 59/131* (2023.02); *G09G 3/3266* (2013.01); *G09G 2300/0426* (2013.01); *G09G 2310/0286* (2013.01); *H01L 2224/02145* (2013.01); *H01L 2224/02381* (2013.01); *H01L 2224/05548* (2013.01); *H01L 2224/05558* (2013.01); *H01L 2224/05573* (2013.01); *H01L 2224/08145* (2013.01)

(56) References Cited

FOREIGN PATENT DOCUMENTS

| | | |
|---|---|---|
| KR | 1020160127276 | 11/2016 |
| KR | 1020170089430 | 8/2017 |
| KR | 1020170135468 | 12/2017 |

\* cited by examiner

[FIG. 1]
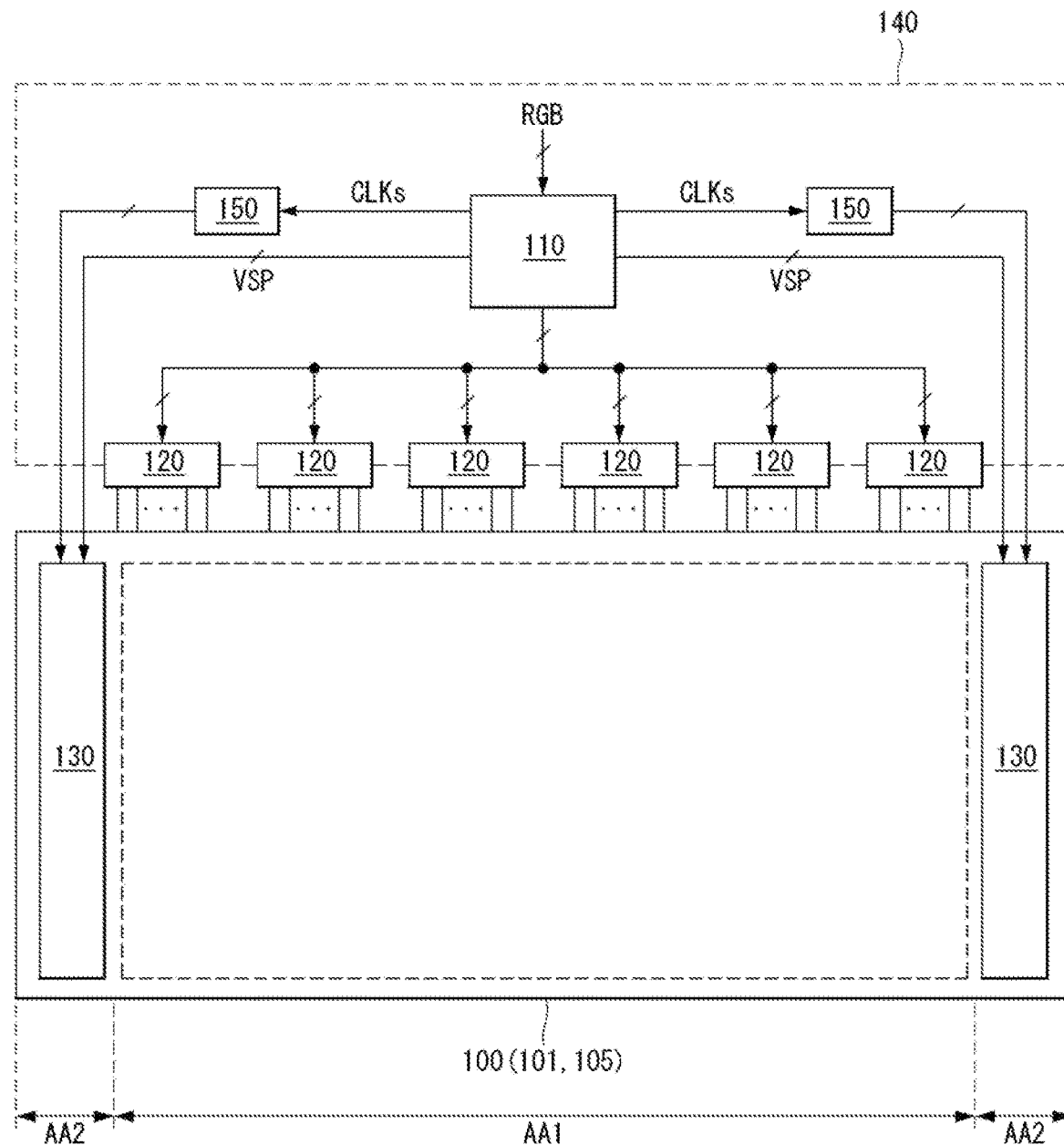

[FIG. 2]
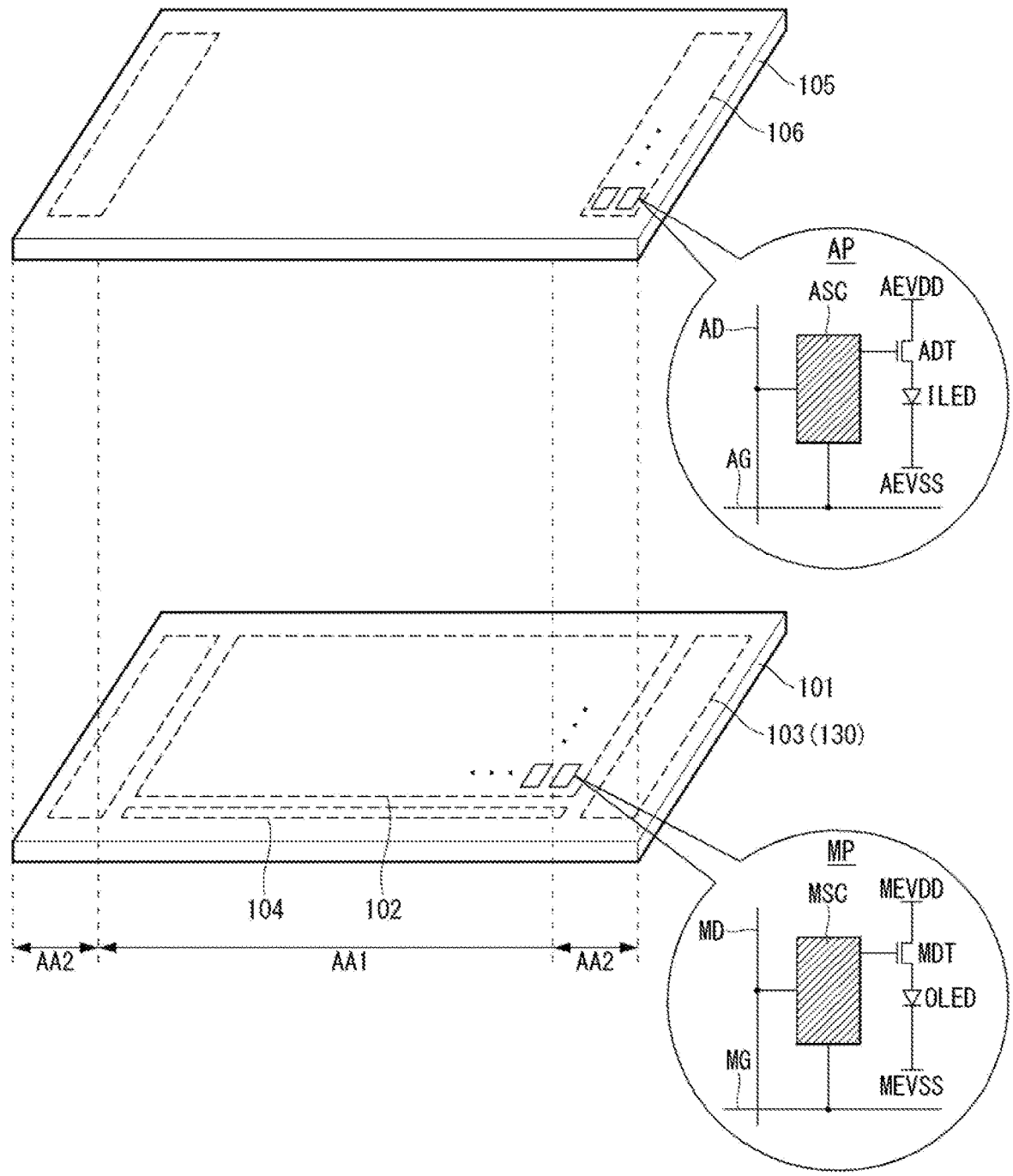

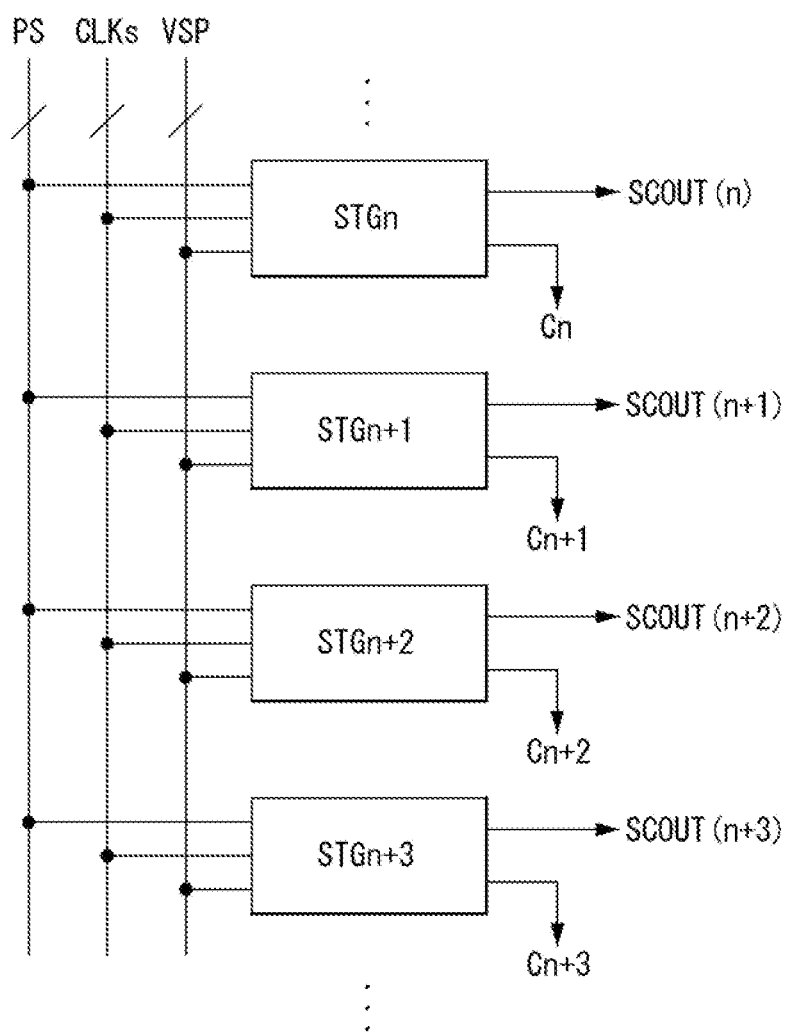

[FIG. 4]
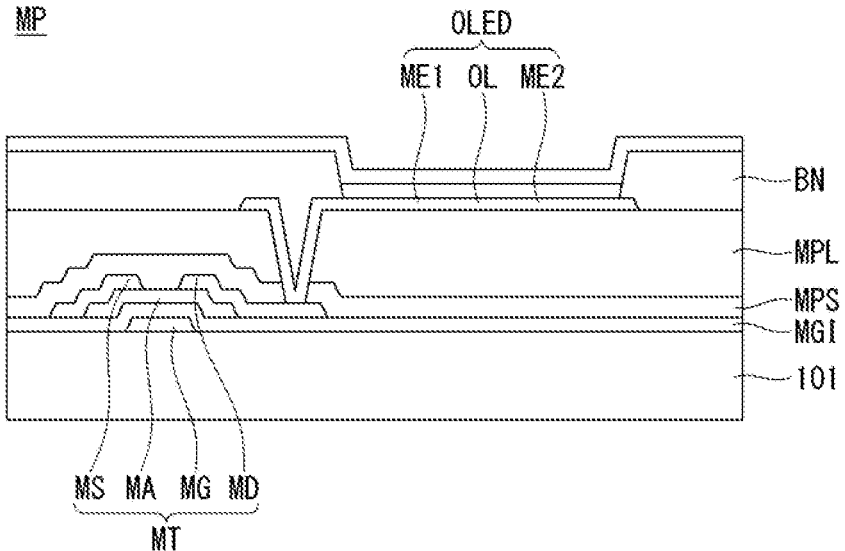
[FIG. 5]
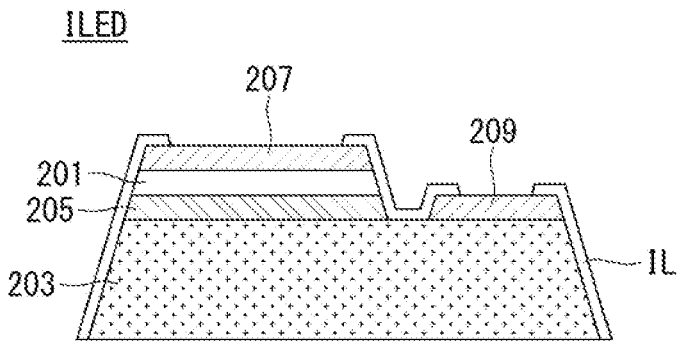
[FIG. 6]
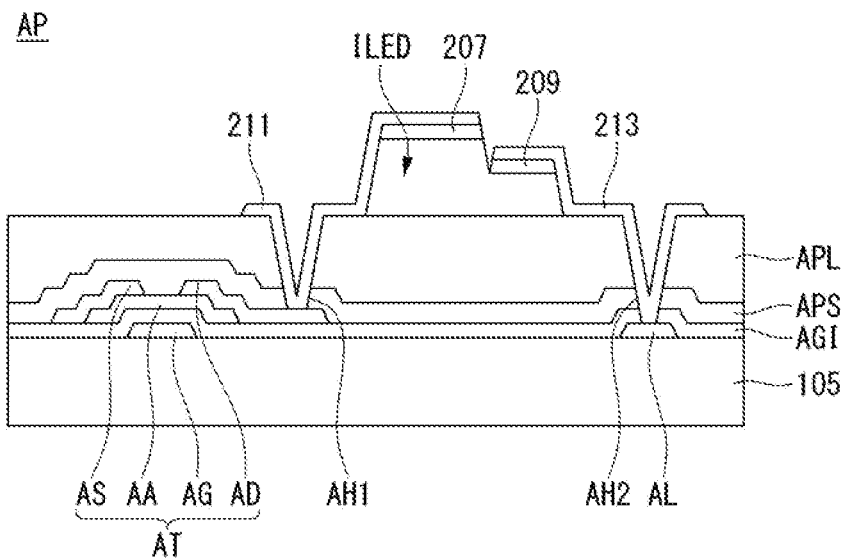

[FIG. 7]
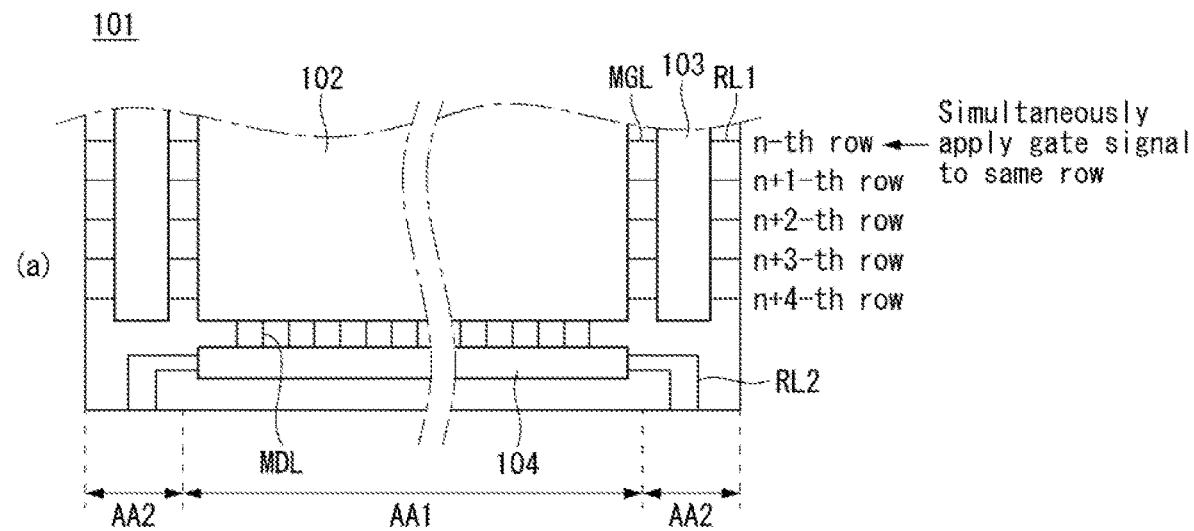
<Rear surface of first substrate>
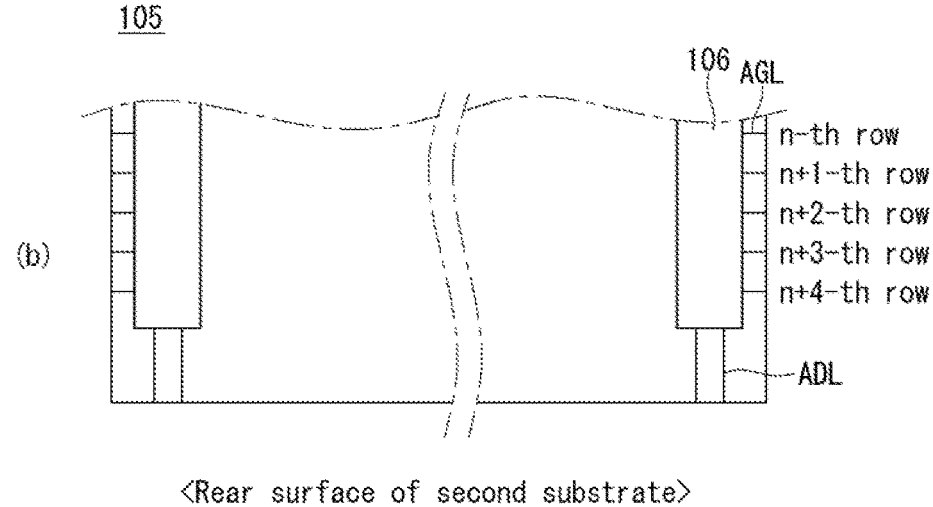
<Rear surface of second substrate>

[FIG. 8]
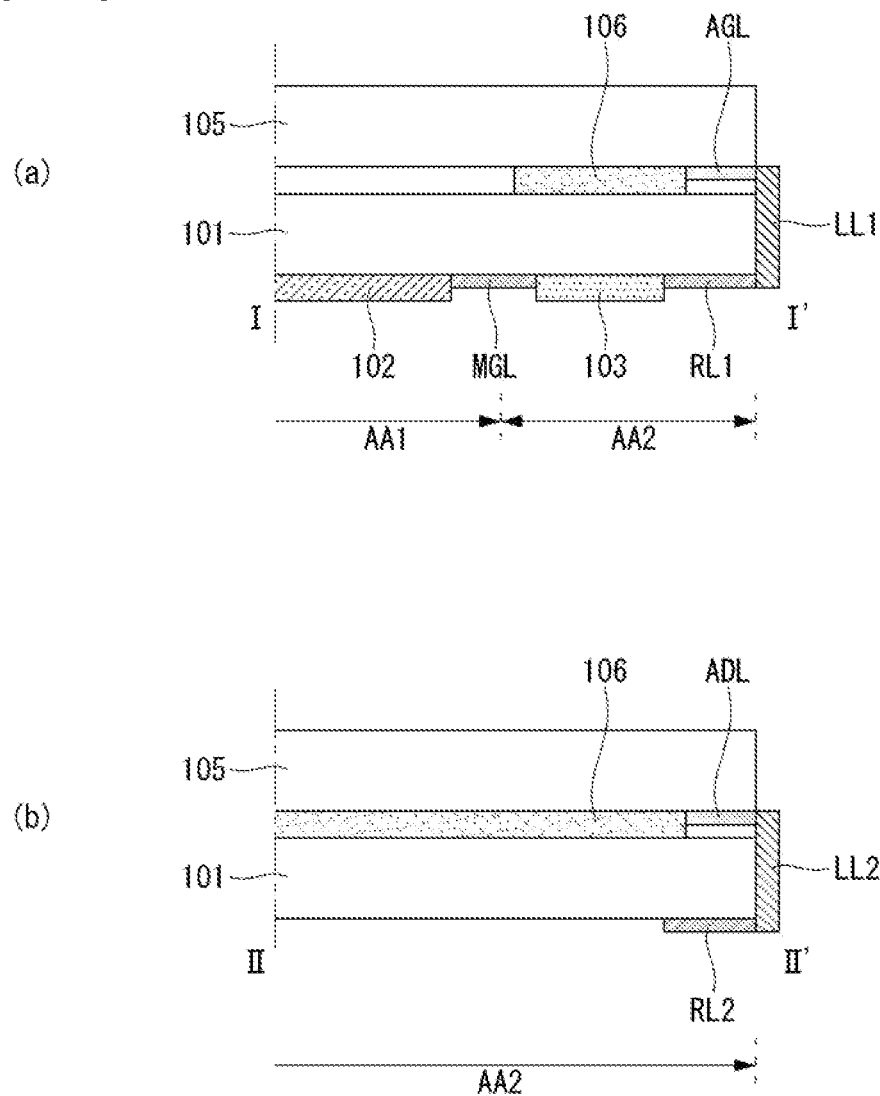

[FIG. 9]
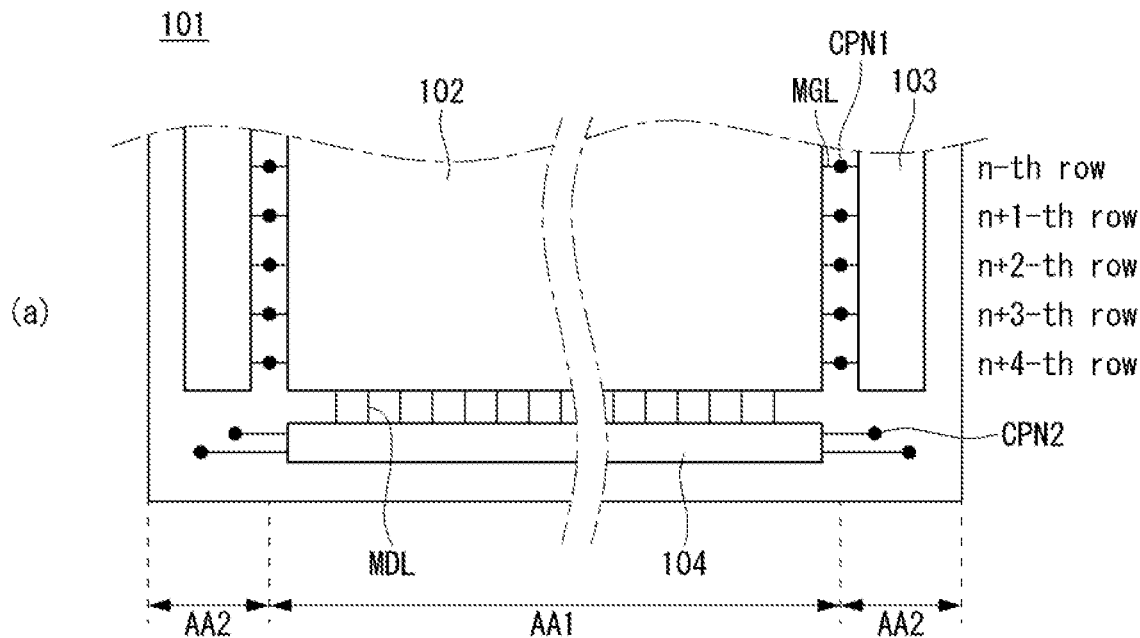
<Front surface of first substrate>
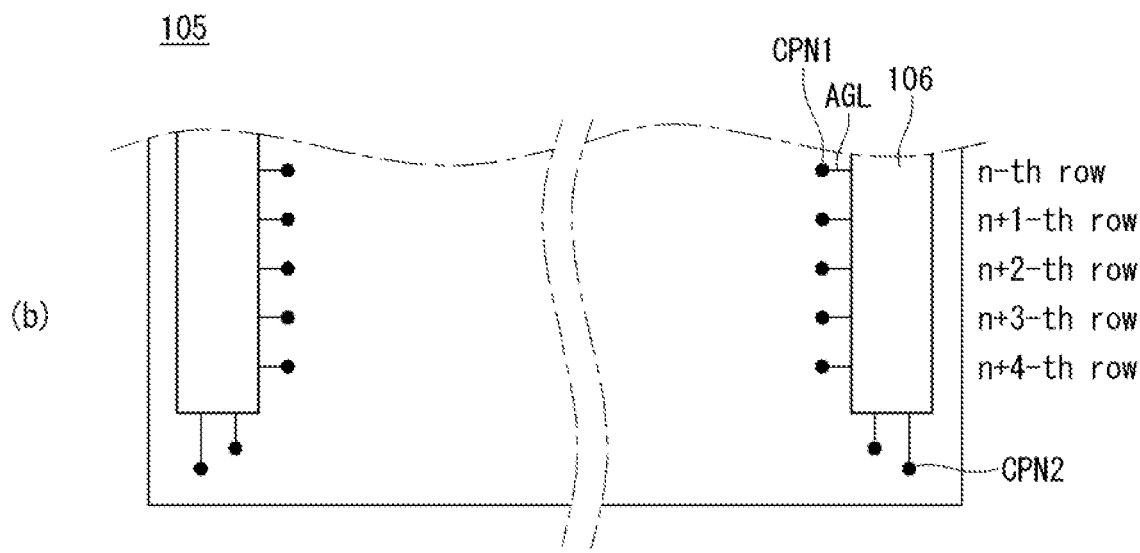
<Rear surface of first substrate>

[FIG. 10]
(a) 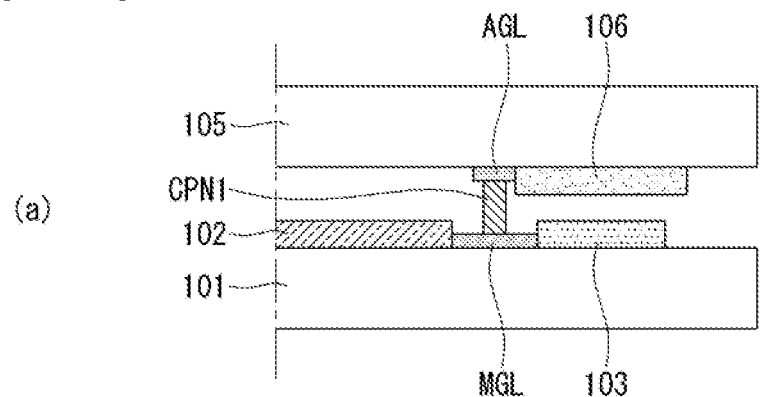
(b) 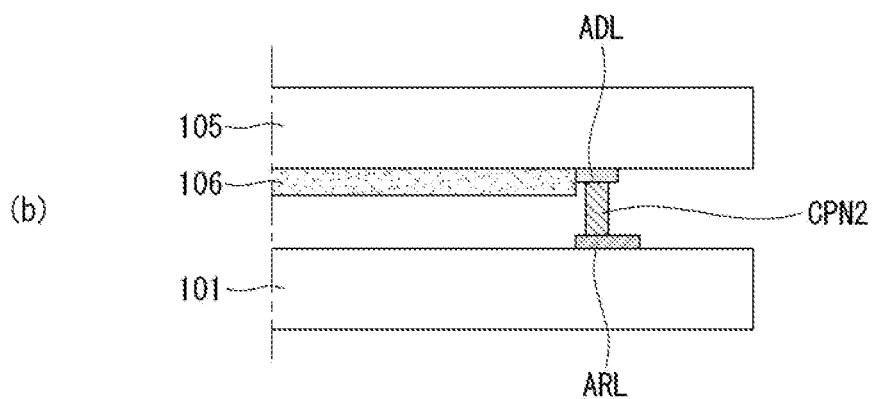

[FIG. 11]
(a) 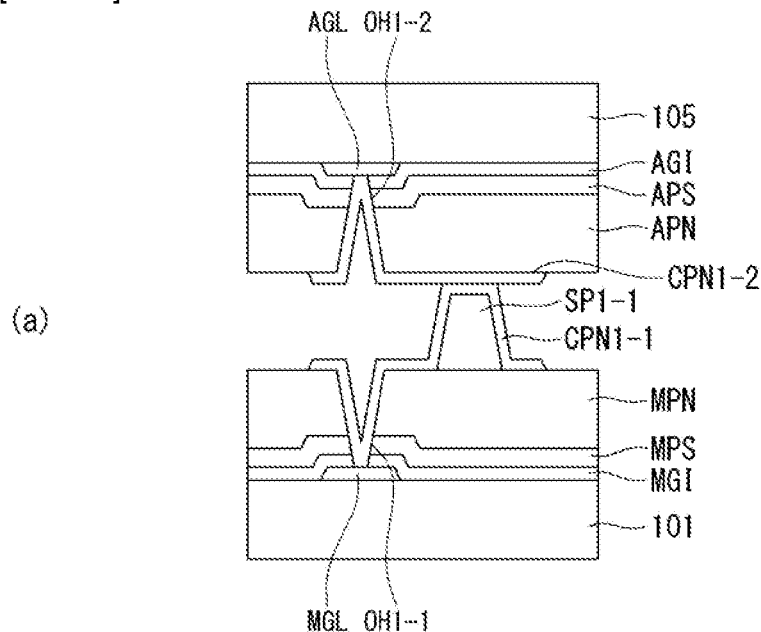
(b) 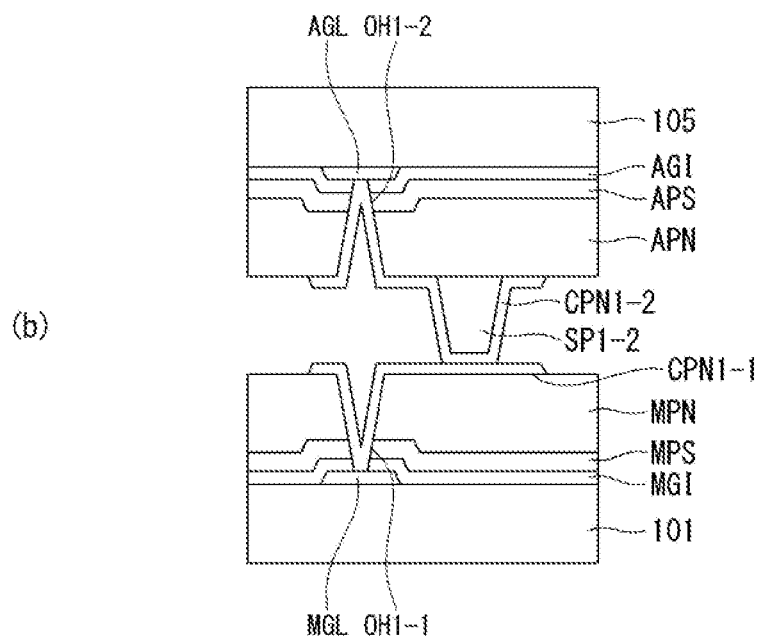

[FIG. 12]
(a) 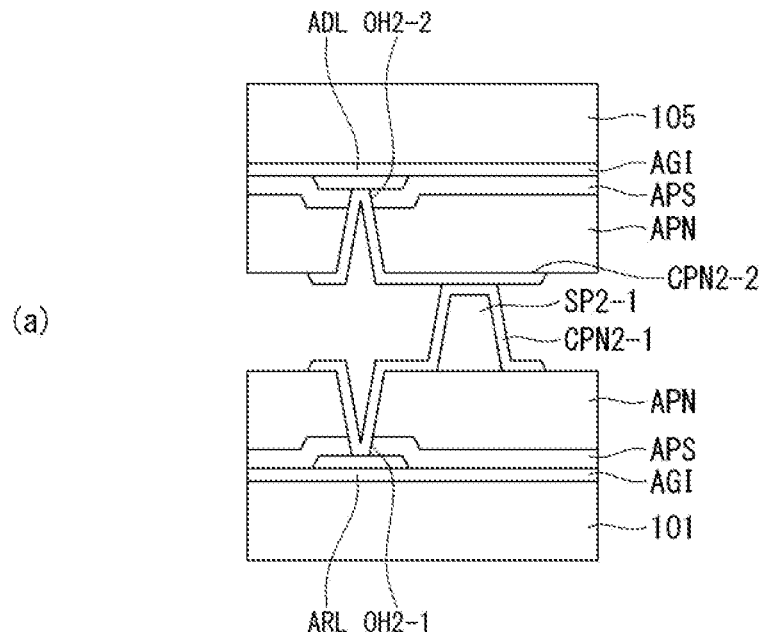
(b) 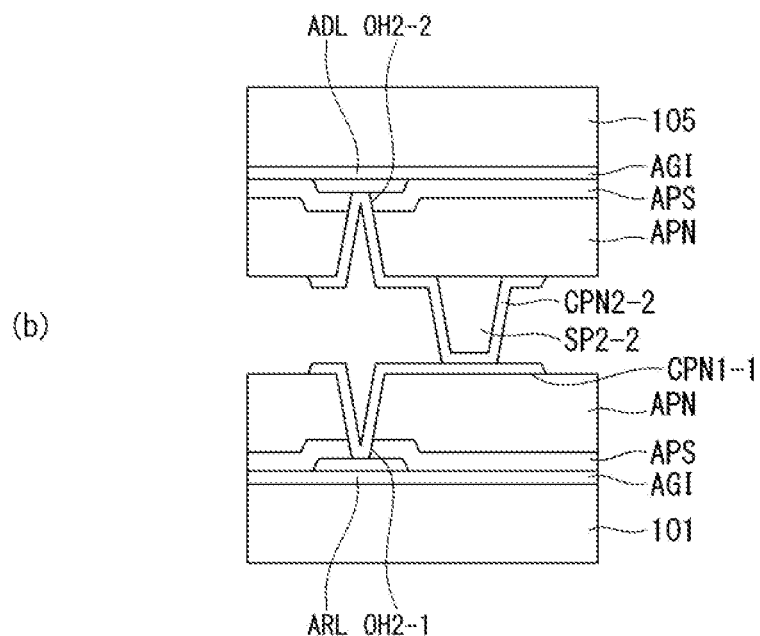

[FIG. 13]
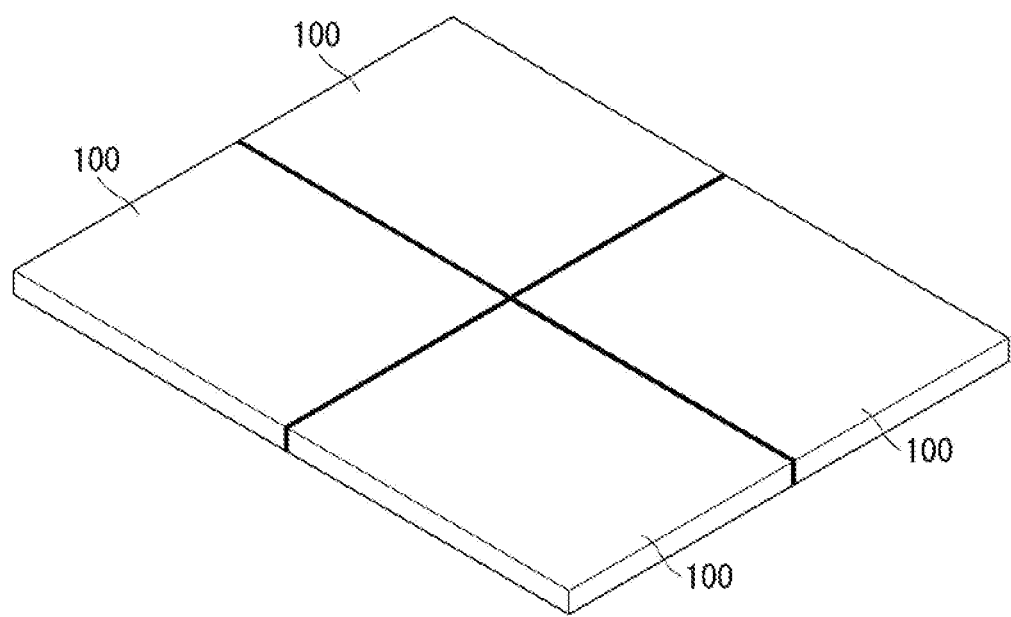

DISPLAY DEVICE

CROSS-REFERENCE TO RELATED APPLICATIONS

This application is the National Stage filing under 35 U.S.C. 371 of International Application No. PCT/KR2019/007001, filed on Jun. 11, 2019, the contents of which are all incorporated by reference herein in their entirety.

TECHNICAL FIELD

The present disclosure relates to a display device. In particular, the present disclosure relates to a display device capable of minimizing a bezel area with maximizing a display area by disposing a light emitting diode in GIP (Gate In Panel) area.

BACKGROUND ART

Various display apparatuses have been developed, which can reduce a weight and a volume as disadvantages of a cathode ray tube. Such display apparatuses can be implemented by a liquid crystal display (LCD), a field emission display (FED), a plasma display panel (PDP), a quantum dot display (QD), and an electroluminescence display.

A display panel constituting the display apparatus includes a display area in which pixels are arranged to implement an input image, and a non-display area on the outside of the display area. The non-display area may be referred to as a bezel area. The pixels may be defined by an intersection structure of signal lines. The signal lines may include gate lines, data lines, and power lines.

The pixels may include a light emitting element driven in response to signals provided from the signal lines. For example, the light emitting element may include an organic light emitting diode (OLED) made of an organic material or an inorganic light emitting diode (ILED) made of an inorganic material.

In recent years, in order to improve an aesthetic sense and an image immersion sense of the display apparatus, an effort for minimizing the non-display area, i.e., an effort for implementing a narrow bezel have been actively conducted. As an effort therefor, pads and driving elements arranged in the non-display area are integrated and designed in a limited area. However, there is a limit to implement an extreme narrow bezel through simple arrangement change of the pads and the driving elements, so other methods need to be devised.

DISCLOSURE

Technical Problem

An object of the present disclosure is to solve the problems and other problems. Another object of the present disclosure is to provide a display device capable of maximizing a display area and minimizing a bezel area by arranging a light emitting diode in a gate in panel (GIP) area.

Technical Solution

In order to achieve the or another object, according to an aspect of the present disclosure, provided is a display device including: a display panel having a first display area and a second display area on the outside of the first display area, in which the display panel includes a first substrate which includes a main pixel unit disposed in the first display area and having main pixels, and a GIP unit disposed in the second display area and generating a gate signal; and a second substrate which is bonded to the first substrate, and includes an auxiliary pixel unit disposed in the second display area and having auxiliary pixels, and the GIP unit supplies the gate signal to the main pixels and the auxiliary pixels.

Further, according to another aspect of the present disclosure, the auxiliary pixel unit may overlap with the GIP unit.

Further, according to another aspect of the present disclosure, the main pixels may include a main transistor and an organic light emitting diode connected to the main transistor, and the auxiliary pixels may include an auxiliary transistor and an inorganic light emitting diode connected to the auxiliary transistor.

Further, according to another aspect of the present disclosure, pixels on the same row among the main pixels and the auxiliary pixels may be applied with the gate signal of the same sequence number.

Further, according to another aspect of the present disclosure, the main pixel unit and the GIP unit may be disposed on a rear surface of the first substrate, and the auxiliary pixel unit may be disposed on the rear surface of the second substrate, the first substrate may include first routing lines connected to the GIP unit, and extended to one end of the first substrate, and the second substrate may include auxiliary gate lines connected to the auxiliary pixel unit, and extended to one end of the second substrate, and the first routing line and the auxiliary gate line may be electrically connected through a first link line extended while surrounding a circumference of one end of the first substrate.

Further, according to another aspect of the present disclosure, the display panel may further include a pad unit disposed on the rear surface of the first substrate, the first substrate may include second routing lines connected to the pad unit, and extended to one end of the first substrate, and the second substrate may include auxiliary data lines connected to the auxiliary pixel unit to forward data voltage to the auxiliary pixel unit, and extended to one end of the second substrate, and the second routing line and the auxiliary data line may be electrically connected through a second link line extended while surrounding the circumference of one end of the first substrate.

Further, according to another aspect of the present disclosure, the first substrate may include main gate lines that forward a gate signal by connecting the GIP unit and the main pixel unit, and the main gate line and the auxiliary gate line arranged on the same row may be applied with the gate signal of the same sequence number.

Further, according to another aspect of the present disclosure, the display device may further include an encapsulation layer disposed on the rear surface of the first substrate and disposed to cover the main pixel unit, and the encapsulation layer may include a metallic material.

Further, according to another aspect of the present disclosure, the main pixel unit and the GIP unit may be disposed on a front surface of the first substrate, and the auxiliary pixel unit may be disposed on the rear surface of the second substrate, the first substrate may include main gate line that forward the gate signal by connecting the GIP unit and the main pixel unit, and the second substrate may include an auxiliary gate line connected to the auxiliary pixel unit and forwarding the gate signal to the auxiliary pixel unit, and the main gate line and the auxiliary gate line may be electrically connected through a first conductive pattern disposed between the first substrate and the second substrate.

Further, according to another aspect of the present disclosure, the main gate line and the auxiliary gate line arranged on the same row may be applied with the gate signal of the same sequence number.

Further, according to another aspect of the present disclosure, the display panel may further include a pad unit disposed on the front surface of the first substrate, the first substrate may include auxiliary routing lines connected to the pad unit, the second substrate may include auxiliary data lines connected to the auxiliary pixel unit and forwarding data voltage to the auxiliary pixel unit, and the auxiliary routing line and the auxiliary data line may be electrically connected through a second conductive pattern disposed between the first substrate and the second substrate.

Further, according to another aspect of the present disclosure, the first conductive pattern may include a 1-1-st conductive pattern formed on the first substrate and a 1-2-nd conductive pattern formed on the second substrate, the 1-1-st conductive pattern may be connected to the main gate line through a 1-1-st open hole penetrating at least one first insulating layer disposed between the main gate line and the 1-1-st conductive pattern, the 1-2-nd conductive pattern may be connected to the auxiliary gate line through a 1-2-nd open hole penetrating at least one second insulating layer disposed between the auxiliary gate line and the 1-2-nd conductive pattern, and the 1-1-st conductive pattern and the 1-2-nd conductive pattern may be connected.

Further, according to another aspect of the present disclosure, the first substrate may further include a 1-1-st spacer disposed on the at least one first insulating layer, and the 1-1-st conductive pattern may be extended to cover a surface of the 1-1-st spacer.

Further, according to another aspect of the present disclosure, the second substrate may further include a 1-2-nd spacer disposed on the at least one second insulating layer, and the 1-2-nd conductive pattern may be extended to cover the surface of the 1-2-nd spacer.

Further, according to another aspect of the present disclosure, the second conductive pattern may include a 2-1-st conductive pattern formed on the first substrate and a 1-2-nd conductive pattern formed on the second substrate, the 2-1-st conductive pattern may be connected to the auxiliary routing line through a 2-1-st open hole penetrating at least one third insulating layer disposed between the auxiliary routing line and the 2-1-st conductive pattern, and the 2-2-nd conductive pattern may be connected to the auxiliary data line through a 2-2-nd open hole penetrating at least one fourth insulating layer disposed between the auxiliary data line and the 2-2-nd conductive pattern, and the 2-1-st conductive pattern and the 2-2-nd conductive pattern may be connected.

Further, according to another aspect of the present disclosure, the first substrate may further include a 2-1-st spacer disposed on the at least one third insulating layer, and the first 2-1-st conductive pattern may be extended to cover the surface of the 2-1-st spacer.

Further, according to another aspect of the present disclosure, the second substrate may further include a 2-2-nd spacer disposed on the at least one fourth insulating layer, and the 2-2-nd conductive pattern may be extended to cover the surface of the 2-2-nd spacer.

Advantageous Effects

Effects of a display device according to the present disclosure will be described below.

According to the present disclosure, a display device capable of maximizing a display area and minimizing a bezel area. As a result, according to the present disclosure, there is an advantage in that an aesthetic sense of the display device can be improved and an image immersion sense of a user can be significantly improved.

DESCRIPTION OF DRAWINGS

FIG. 1 is a diagram schematically illustrating a display device according to the present disclosure.

FIG. 2 is a perspective view schematically illustrating a display panel of FIG. 1.

FIG. 3 is a diagram schematically illustrating a connection configuration between stages of a gate shift register included in a gate driver of FIG. 1.

FIG. 4 is a cross-sectional view illustrating a configuration example of a main pixel in which an organic light emitting diode is arranged.

FIG. 5 is a cross-sectional view illustrating a configuration example of an inorganic light emitting diode.

FIG. 6 is a cross-sectional view illustrating a configuration example of an auxiliary pixel in which the inorganic light emitting diode is arranged.

FIGS. 7 and 8 are diagrams schematically illustrating a configuration for forwarding driving signals to a main pixel and an auxiliary pixel according to an embodiment of the present disclosure.

FIGS. 9 and 10 are diagrams schematically illustrating a configuration for forwarding driving signals to a main pixel and an auxiliary pixel according to another embodiment of the present disclosure.

FIG. 11 is a diagram illustrating a transmission path example of a gate signal corresponding to FIGS. 9 and 10.

FIG. 12 is a diagram illustrating a transmission path example of a data signal corresponding to FIGS. 9 and 10.

FIG. 13 is a diagram illustrating an application example of a display device according to the present disclosure.

MODE FOR DISCLOSURE

Hereinafter, preferred embodiments of the present disclosure will be described with reference to the accompanying drawings. Throughout the present disclosure, like reference numerals mean substantially like elements. In the following description, a detailed explanation of known technologies or configurations related to the present disclosure may be omitted to avoid unnecessarily obscuring the subject matter of the present disclosure. In describing various embodiments, like elements may be omitted in another embodiment in which the elements are representatively described at a beginning part.

Terms including an ordinary number, such as first and second, are used for describing various elements, but the elements are not limited by the terms. The terms are used only to discriminate one element from another element.

FIG. 1 is a diagram schematically illustrating a display device according to the present disclosure. FIG. 2 is a perspective view schematically illustrating a display panel of FIG. 1. FIG. 3 is a diagram schematically illustrating a connection configuration between stages of a gate shift register included in a gate driver of FIG. 1.

Referring to FIGS. 1 and 2, the display device according to the present disclosure includes a display panel 100, a data driving circuit, gate drivers 130 and 150, and a timing controller 110.

The display panel 100 includes a first display area AA1 and a second display area AA2. In the first display area AA1 and the second display area AA2, an input image may be implemented. The display panel 100 includes a first substrate 101 and a second substrate 105 bonded to each other.

The first substrate 101 may include a main pixel unit provided to correspond to the first display area AA1 and having main pixels MP, and a gate in panel (GIP) unit 103 provided to correspond to the second display area AA2 and having a gate shift register 130. Each of the main pixels MP may include a main light emitting element, and the main light emitting element may be an organic light emitting diode (OLED).

The main pixel unit 102 may include multiple main data lines MDL and multiple main gate lines MGL which cross each other, and the main pixels MP are arranged in a matrix form in an intersection area to constitute a main pixel (MP) array. Each main pixel MP may include an organic light emitting diode (OLED) a driving thin film transistor (TFT) (MDT), a storage capacitor, and a switching unit MSC having at least one switch TFT. The TFTs may be implemented as a P type, implemented as an N type, or a hybrid type in which the P type and the N type are mixedly used. Further, a semiconductor layer of the TFT may include amorphous silicon, polysilicon, or oxide. Each main pixel MP is connected to a high-potential voltage source and a low-potential voltage source to be supplied with main high-potential power voltage (EVSS) and main low-potential power voltage (MEVDD).

The second substrate 105 may include an auxiliary pixel unit 106 provided to correspond to the second display area AA2 and having a plurality of auxiliary pixels AP. Each of the auxiliary pixels MP may include an auxiliary light emitting element, and the auxiliary light emitting element may be an inorganic light emitting diode (ILED). The organic light emitting diode and the inorganic light emitting diode may be distinguished according to a fluorescent material used for a light emitting layer.

The auxiliary pixel unit 106 may include multiple auxiliary data lines ADL and multiple auxiliary gate lines AGL which cross each other, and the auxiliary pixels AP are arranged in the matrix form in the intersection area to constitute an auxiliary pixel (AP) array. Each auxiliary pixel AP may include the inorganic light emitting diode (ILED) a driving thin film transistor (TFT) (ADT), a storage capacitor, and a switching unit ASC having at least one switch TFT. The TFTs may be implemented as a P type, implemented as an N type, or a hybrid type in which the P type and the N type are mixedly used. Further, a semiconductor layer of the TFT may include amorphous silicon, polysilicon, or oxide. Each auxiliary pixel AP is connected to a high-potential voltage source and a low-potential voltage source to be supplied with auxiliary high-potential power voltage (AEVSS) and auxiliary low-potential power voltage (AEVDD).

A data driving circuit includes multiple source drive ICs 120. The source drive ICs 120 are input with image data (RGB) from the timing controller 110. The source drive ICs 120 generates data voltage by converting the image data (RGB) into gamma compensation voltage in response to a source timing control signal from the timing controller 110, and supplies the data voltage to the main data lines MDL of the main pixel unit 120 and the auxiliary data lines ADL of the auxiliary pixel unit 106 so as to synchronize the data voltage with the gate signals. The source drive ICs 120 may be connected to the pad unit 104 of the first substrate 101 by a chip on glass (COG) process or a tape automated bonding (TAB) process. Pads of the pad unit 104 may be electrically connected to the main data lines MDL of the main pixel unit 102 and the auxiliary data lines ADL of the auxiliary pixel unit 106 through routing lines. The pad unit 104 may be disposed on the outside of the first display area AA1 and the second display area AA2.

The gate drivers 130 and 150 include a level shifter 150 and a gate shift register 130 connected between the timing controller 110 and the gate lines MGL and AGL of the display panel 100.

The level shifter 150 level-shifts a transistor-transistor-logic (TTL) level voltage of clock signals CLKs input from the timing controller 110 to gate high voltage and gate low voltage to switch the TFT formed in the display panel 100. The gate shift register 130 outputs the gate signal to the main gate lines MGL of the main pixel unit 102 and the auxiliary gate lines AGL of the auxiliary pixel unit 106. For example, the gate shift register 130 may apply the gate signal to both the main pixels MP and the auxiliary pixels AP arranged in the same row through the main gate line MGL and the auxiliary gate line AGL corresponding to each other. When differently expressed, the gate shift register 130 may sequentially supply the gate signal in units of the row. Accordingly, the main pixels MP and the auxiliary pixels AP arranged in the same row may be simultaneously applied with the gate signal of the same sequence number.

The gate shift register 130 may be directly formed on the first substrate 101 of the display panel 100 in a gate in panel (GIP) scheme. That is, the gate shift register 130 may be formed at a location corresponding to the second display area AA2 on the first substrate 101.

In the GIP scheme, the level shifter 150 may be mounted on a PCB 140. The gate shift register 130 may be formed on one side of the first substrate 101, and formed on both sides of the first substrate 101 as illustrated. In the case of a large panel in which an RC delay in a gate line is large, the gate shift register 130 is preferably formed on both sides of the first substrate 101. As such, distortion of the gate signal due to the RC delay may be minimized.

The timing controller 110 is input with the image data (RGB) from an external host system through various known interface schemes. The timing controller 110 may correct the image data (RGB), and then transmit the corrected image data to the source drive ICs 120 so as to compensate an electrical characteristic deviation of the pixels based on a sensing result according to real-time sensing.

The timing controller 110 is input with timing signals such as a vertical synchronization signal Vsync, a horizontal synchronization signal Hsync, a data enable signal Data Enable (DE), a main clock MCLK, etc. The timing controller 110 generates a data timing control signal for controlling an operation timing of a data driving circuit and a scan timing control signal for controlling an operation timing of a gate driver based on a timing signal from the host system.

The scan timing control signal includes a start signal VSP and clock signals CLKs.

The data timing control signal includes a source sampling clock (SSC), a source output enable (SOE), etc. The source sampling clock (SSC) is a clock signal for controlling a sampling timing of data within the source drive ICs 120 based on a rising or falling edge. The source output enable signal (SOE) is a signal for controlling an output timing of data voltage.

Referring back to FIG. 3, the gate shift register according to an embodiment of the present disclosure includes multiple stages STGn to STGn+3 connected dependently on each other. The stages STGn to STGn+3 may be GIP elements formed in a gate driver in panel (GIP) scheme. At least one upper dummy stage may be further disposed on a front end of an uppermost stage, and at least one lower dummy stage may be further disposed on a rear end of a lowermost stage.

The stages STGn to STGn+3 generate gate signals SCOUT(n) to SCOUT(n+3), and carry signals Cn to Cn+3. The stages STGn to STGn+3 generate the carry signals Cn to Cn+3 independently from the gate signals SCOUT(n) to SCOUT(n+3) to prevent the carry signal from being distorted by a gate signal having a relatively large load. The stages STGn to STGn+3 generate the gate signals SCOUT(n) to SCOUT(n+3) to supply the generated gate signals SCOUT(n) to SCOUT(n+3) to the main gate lines MGL of the main pixel unit 102 and the auxiliary gate lines AGL of the auxiliary pixel unit 106. The stages STGn to STGn+3 generate the carry signals Cn to Cn+3 to supply the generated carry signals Cn to Cn+3 to any one of rear stages as a start signal and supply the generated carry signals Cn to Cn+3 to any one of front stages as a reset signal.

The stages STGn to STGn+3 may be supplied with a global start signal VSP, clock signals CLKs, a global reset signal (not illustrated), etc., from an external timing controller (not illustrated) in order to generate the gate signals SCOUT(n) to SCOUT(n+3) and the carry signals Cn to Cn+3.

The global start signal VSP, the clock signals CLKs, and the global reset signal are signals commonly supplied to the stages STGn to STGn+3. The global start signal VSP may be further supplied to a start terminal of an upper dummy stage, and the global reset signal may be further supplied to a reset terminal of the lower dummy stage.

Each of the stages STGn to STGn+3 activates an operation of node Q according to a front carry signal applied to the start terminal every frame. The front carry signal is a carry signal applied from any one of the front stages. In this case, some of the stages STGn to STGn+3 may be input with the carry signal from the upper dummy stage. The upper dummy stage operates according to the global start signal VSP to supply the carry signal to some of upper stages.

Each of the stages STGn to STGn+3 deactivates the operation of node Q according to a rear carry signal applied to the reset terminal every frame. The rear carry signal is a carry signal applied from any one of the rear stages. In this case, some of the stages STGn to STGn+3 may be input with the carry signal from the lower dummy stage. The lower dummy stage operates according to the global reset signal to supply the carry signal to some of lower stages.

Each of the stages STGn to STGn+3 includes an inverter unit to control a potential of node Qb opposite to node Q. The inverter unit includes at least one transistor pair connected between node Qb and low-potential power voltage in series to increase stability and reliability of the operation.

At least one clock signal CLKs may be supplied to each of the stages STGn to STGn+3. The clock signals CLKs may include scan shift clocks and carry shift clocks in which phases are sequentially shifted. The scan shift clocks are clock signals for generating the gate signals SCOUT(n) to SCOUT(n+3), and the carry shift clocks are clock signals for generating the carry signals Cn to Cn+3. The scan shift clocks are swung between the gate high voltage and the gate low voltage to be synchronized with the gate signals SCOUT(n) to SCOUT(n+3). The carry shift clocks are swung between the gate high voltage and the gate low voltage to be synchronized with the carry signals Cn to Cn+3.

The clock signals CLKs may be overlap-driven in order to secure a sufficient charge time upon high-speed driving. Clocks of neighboring phases according to the overlap driving may be overlapped by a partial predetermined gate high interval.

Each of the stages STGn to STGn+3 may be supplied with power voltage PS from an external power supply unit (not illustrated). The power voltage PS includes high-potential power voltage and low-potential power voltage.

In the present disclosure, since the GIP unit 103 is formed in the second display area AA2, the second display area AA2 is an area allocated to a bezel area in which the input image is not implemented. In the present disclosure, there is an advantage in that since the input image may be implemented by applying the inorganic light emitting diode (ILED) even to the area where the GIP unit 103, a display area may be maximized and the bezel area is minimized to improve an image immersion sense of the user.

In the figure, a case where the auxiliary pixel unit AP is applied only to both sides of the display panel 100 corresponding to the GIP unit 103 is illustrated as an example, but the present disclosure is not limited thereto, and as necessary, the auxiliary pixel unit AP may be selectively applied to upper/lower/left/right sides of the display panel 100.

FIG. 4 is a cross-sectional view illustrating a configuration example of a main pixel in which an organic light emitting diode is arranged.

Referring to FIG. 4, the main pixel MP may include a main transistor MT disposed on the first substrate 101, and an organic light emitting diode OLED electrically connected to the main transistor MT. As illustrated in FIG. 4, the main transistor MT may be implemented as a bottom gate structure, but is not limited thereto, and may be implemented as various structures such as a top gate structure, a double gate structure, etc.

The main transistor MT is disposed on the first substrate 101. The main transistor MT includes a main gate electrode MG, a main semiconductor layer MA, a main source electrode MS, and a main drain electrode MD.

The main gate electrode MG is disposed on the first substrate 101. The main semiconductor layer MA is disposed on a main gate insulator MGI covering the main gate electrode MG. The main semiconductor layer MA is disposed to be at least partially overlapped with the main gate electrode MG. The main drain electrode MD contacts one side of the main semiconductor layer MA. The main source electrode MS contacts the other side of the main semiconductor layer MA and the disposed spaced apart from the main drain electrode MD.

The organic light emitting diode OLED is disposed on the main insulating layer covering the main transistor MT. The main insulating layer may include at least any one of a protective film MPS and an advanced planarization layer MPL. The protective film MPS may contain an inorganic insulating material, and the advanced planarization layer MPL may contain an organic insulating material. The planarization film MPL contains the organic insulating material to serve as a planarization layer.

The organic light emitting diode OLED includes an anode electrode ME1, an organic light emitting layer OL, and a cathode electrode ME2. The anode electrode ME1 is connected to the drain electrode MD of the main transistor MT through a main pixel contact hole MH penetrating the main insulating layer. A bank layer BN may be further disposed on the anode electrode ME1. The bank layer BN exposes most of the anode electrode ME1. A portion of the anode electrode ME1 exposed by the bank layer BN may be defined as a light emitting area.

The organic light emitting layer OL is disposed on the anode electrode ME1 exposed by the bank layer BN. The organic light emitting layer OL as a layer which emits light by combining electrons and holes may include an emission layer EML, and further include at least any one of a hole injection layer HIL, a hole transport layer HTL, an electron transport layer ETL, and an electron injection layer EIL.

The cathode electrode ME2 is disposed on the organic emitting layer OL and disposed opposite to the anode electrode ME1.

FIG. 5 is a cross-sectional view illustrating a configuration example of an inorganic light emitting diode. FIG. 6 is a cross-sectional view illustrating a configuration example of an auxiliary pixel in which the inorganic light emitting diode is arranged.

Referring to FIG. 5, the inorganic light emitting diode ILED is a semiconductor light emitting element that emits light energy of various wavelengths by applying an electrical signal using characteristics of a compound semiconductor. The inorganic light emitting diode ILED may be formed to have a small size in units of several microns. The inorganic light emitting diode ILED may be referred to as an LED chip, a micro LED chip, a mini LED chip, etc.

The inorganic light emitting diode ILED includes a first semiconductor layer 201, a second semiconductor layer 203, and an active layer 205. The first semiconductor layer 201 is formed on at least one upper surface of the semiconductor layer 203 to expose at least a part of the other upper surface of the second semiconductor layer 203. The active layer 205 is interposed between the first semiconductor layer 201 and the second semiconductor layer 203.

A first electrode 207 is formed on the first semiconductor layer 201 and electrically connected to the first semiconductor layer 201. A second electrode 209 is formed on the exposed second semiconductor layer 203 and electrically connected to the second semiconductor layer 203. The first electrode 207 and the second electrode 209 are disposed spaced apart from each other by a predetermined interval. The first electrode 207 and the second electrode 209 may contain oxide-series transparent conductive materials such as titanium dioxide (TiO2), aluminum zinc oxide (AZO), zinc oxide (ZnO), indium tin oxide (ITO), gallium zinc oxide (GZO), and indium zinc oxide (IZO), and also include Pedot: PSS-series conductive material grapheme, metallic wire, etc.

The first semiconductor layer 201 may be implemented as a p type semiconductor layer. The first semiconductor layer 201 may be implemented as a semiconductor compound, e.g., compound semiconductors such as II group-IV group and III group-V group. The first semiconductor layer 210 may be formed by a single layer or multiple layers. The first semiconductor layer 201 may contain a semiconductor material having a composition formula of $In_xAl_yGa_{1-x-y}N$ ($0 \leq x \leq 1$, $0 \leq y \leq 1$, $0 \leq x+y \leq 1$), but is not limited thereto. For example, the first semiconductor layer 201 may be selected from GaN, AlN, AlGaN, InN, InAlGaN, AlInN, AlGaAs, GaP, GaAs, GaAsP, AlGaInP, etc., and doped with a p type dopant such as Mg, Zn, Ca, Sr, Ba, etc.

The second semiconductor layer 203 may be implemented as an n type semiconductor layer. The second semiconductor layer 203 may be implemented as the semiconductor compound, e.g., the compound semiconductors such as II group-IV group and III group-V group. The second semiconductor layer 203 may be formed by the single layer or multiple layers. The second semiconductor layer 203 may contain a semiconductor material having a composition formula of $In_xAl_yGa_{1-x-y}N$ ($0 \leq x \leq 1$, $0 \leq y \leq 1$, $0 \leq x+y \leq 1$), but is not limited thereto. For example, the second semiconductor layer 203 may be selected from GaN, AlN, AlGaN, InN, InAlGaN, AlInN, AlGaAs, GaP, GaAs, GaAsP, AlGaInP, etc., and doped with an n type dopant such as Si, Ge, Sn, Se, Te, etc.

The active layer 205 is a layer in which holes injected through the first semiconductor layer 201 and electrons injected through the second semiconductor layer 203 meet each other to emit light by a band gap difference of an energy band according to a forming material of the active layer 205. The active layer 205 may selectively a single quantum well (SQW), a multi quantum well (MQW), a quantum wire structure, or a quantum dot structure. The active layer 205 may be configured by the compound semiconductor. For example, the active layer 205 may be implemented as at least one of the II group-IV group and III group-V group compound semiconductors.

The inorganic light emitting diode ILED may further include an insulating layer IL for protecting elements of the inorganic light emitting diode ILED. The insulating layer IL may cover an exposed external surface of the inorganic light emitting diode ILED, but expose at least a part of the first electrode 207 and at least a part of the second electrode 209. The insulating layer IL may contain the insulating material. For example, the insulating layer IL may be made of any one selected from a silicon oxide film (SiOx) and a silicon nitride film (SiNx), or a lamination structure thereof.

Referring back to FIG. 6, the auxiliary pixel AP may include an auxiliary transistor AT disposed on the second substrate 205, and an inorganic light emitting diode ILED electrically connected to the auxiliary transistor AT. As illustrated in FIG. 6, the auxiliary transistor AT may be implemented as the bottom gate structure, but is not limited thereto, and may be implemented as various structures such as the top gate structure, the double gate structure, etc.

The auxiliary transistor AT is disposed on the second substrate 205. The auxiliary transistor AT includes an auxiliary gate electrode AG, an auxiliary semiconductor layer AA, an auxiliary source electrode AS, and an auxiliary drain electrode AD.

The auxiliary gate electrode AG is disposed on the second substrate 205. The auxiliary semiconductor layer AA is disposed on an auxiliary gate insulator AGI covering the auxiliary gate electrode AG. The auxiliary semiconductor layer AA is disposed to be at least partially overlapped with the auxiliary gate electrode AG. The auxiliary drain electrode AD contacts one side of the auxiliary semiconductor layer AA. The auxiliary source electrode AS contacts the other side of the auxiliary semiconductor layer MA and the disposed spaced apart from the auxiliary drain electrode AD.

The inorganic light emitting diode ILED is disposed on the auxiliary insulating layer covering the auxiliary transistor AT. As illustrated, the auxiliary insulating layer may include at least any one of a protective film (APS) and an advanced planarization layer (APL). The protective film APS may contain an inorganic insulating material, and the advanced planarization layer APL may contain an organic insulating material. The advanced planarization layer APL contains the inorganic insulating material to serve as a planarization layer. Although not illustrated, the inorganic light emitting diode ILED may be inserted into a groove provided by removing a part of the auxiliary insulating layer.

An adhesive layer 210 may be interposed between the auxiliary insulating layer and the inorganic light emitting diode ILED. The adhesive layer 210 may fix the inorganic light emitting diode ILED onto a transfer substrate 30.

A first conductive layer 211 electrically connects the first electrode 207 of the inorganic light emitting diode ILED and the auxiliary transistor AT. The first conductive layer 211 may directly contact the first electrode 207 of the inorganic light emitting diode ILED on one upper portion of the inorganic light emitting diode ILED. The first conductive layer 211 may directly contact the auxiliary transistor AT through a first contact hole AH1 penetrating the protective film APS, the advanced planarization layer APL, and the adhesive layer 210.

A second conductive layer 213 electrically connects the second electrode 209 of the inorganic light emitting diode ILED and a common line AL. The second conductive layer 213 may directly contact the second electrode 209 of the inorganic light emitting diode ILED on the other upper portion of the inorganic light emitting diode ILED. The second conductive layer 213 may directly contact the common line AL through a second contact hole AH2 penetrating a layer interposed between the inorganic light emitting diode ILED and the common line AL, e.g., the auxiliary gate insulator AGI, the protective film APS, the advanced planarization layer APL, and the adhesive layer 210.

FIGS. 7 and 8 are diagrams schematically illustrating a configuration for forwarding driving signals to a main pixel and an auxiliary pixel according to an embodiment of the present disclosure.

Referring to FIGS. 7 and 8, the display panel 100 of the display device includes a first substrate 101 and a second substrate 105 bonded to each other. The main pixel unit 102, the GIP unit 103, and the pad unit 104 may be formed on a rear surface of the first substrate 101. The auxiliary pixel unit 106 may be formed on the rear surface of the second substrate 105. A front surface as a surface to which light is emitted from the light emitting element may refer to one surface of each of the first substrate 101 and the second substrate 105. The rear surface as a surface opposite to the front surface may refer to the other surface of each of the first substrate 101 and the second substrate 105.

The first substrate 101 may include main gate lines MGL for forwarding the gate signal provided from the GIP unit 103 to the main pixel unit 102 and main data lines MDL for forwarding the data voltage provided from the source drive IC 120 to the main pixel unit 102.

The first substrate 101 may include first routing line RL1 for forwarding the gate signal provided from the GIP unit 103 and second routing lines RL2 for forwarding the data voltage provided from the source drive IC 120. The first routing line RL1 may be connected to the GIP unit 103 and extended to one end of the first substrate 101. The second routing lines RL2 may be connected to the pad unit 104 and extended to one end of the first substrate 101. One end of the first substrate 101 to which the first routing line RL1 is extended and one end of the first substrate 101 to which the second routing line RL2 is extended may be different.

The second substrate 105 may include auxiliary gate lines AGL for forwarding the gate signal to the auxiliary pixels AP and auxiliary data lines ADL for forwarding the data voltage to the auxiliary pixels AP. The auxiliary gate lines AGL may be connected to corresponding auxiliary pixels AP and extended to one end of the second substrate 105. The auxiliary data line ADL may be connected to corresponding auxiliary pixels AP and extended to one end of the second substrate 105. One end of the second substrate 105 to which the auxiliary gate line AGL is extended and one end of the second substrate 105 to which the auxiliary data line ADL is extended may be different. One end of the first substrate 101 to which the first routing line RL1 is extended and one end of the second substrate 105 to which the auxiliary gate line AGL is extended may correspond to each other. One end of the first substrate 101 to which the second routing line RL2 is extended and one end of the second substrate 105 to which the auxiliary data line ADL is extended may correspond to each other.

The display panel 100 may include a first link line LL1 and a second link line LL2.

The first link line LL1 may connect the first routing line RL1 of the first substrate 101 and the auxiliary gate line AGL of the second substrate 105. One end of the first link line LL1 may be connected to the first routing line RL1 and the other end may be connected to the auxiliary gate line AGL. The first link line LL1 may be extended while surrounding a circumference of one end of the first substrate 101. The first link line LL1 may be made of a conductive material such as Ag, and electrically connect the first routing line RL1 and the auxiliary gate line AGL.

The second link line LL2 may connect the second routing line RL2 of the first substrate 101 and the auxiliary data line ADL of the second substrate 105. One end of the second link line LL2 may be connected to the second routing line RL2 and the other end may be connected to the auxiliary data line ADL. The second link line LL2 may be extended while surrounding the circumference of one end of the first substrate 101. The second link line LL2 may be made of the conductive material such as Ag, and electrically connect the second routing line RL2 and the auxiliary data line ADL.

Although not illustrated, in addition to the gate signal and the data voltage, driving signals for driving the auxiliary pixels AP may also be supplied to the auxiliary pixel AP by the same scheme as the gate signal and the data voltage.

The first substrate 101 may further include an encapsulation layer 300 disposed to cover the main pixel unit 102. The encapsulation layer 300 may serve to prevent a decrease in lifespan of the organic light emitting diode OLED and luminance deterioration by preventing moisture and/or oxygen from being introduced into the organic light emitting diode OLED of the main pixel unit 102. The encapsulation layer 300 may contain a metallic material. For example, the encapsulation layer 300 may be made of invar which is an alloy of iron (Fe) and nickel (Ni), or steel use stainless (SUS).

FIGS. 9 and 10 are diagrams schematically illustrating a configuration for forwarding driving signals to a main pixel and an auxiliary pixel according to another embodiment of the present disclosure.

Referring to FIGS. 9 and 10, the display panel 100 of the display device includes a first substrate 101 and a second substrate 105 bonded to each other. The main pixel unit 102, the GIP unit 103, and the pad unit 104 may be formed on the front surface of the first substrate 101. The auxiliary pixel unit 106 may be formed on the rear surface of the second substrate 105. The front surface as a surface to which light is emitted from the light emitting element may refer to one surface of each of the first substrate 101 and the second substrate 105. The rear surface as a surface opposite to the front surface may refer to the other surface of each of the first substrate 101 and the second substrate 105. The second substrate 105 may be disposed to cover the main pixel unit 102 and serve as an encapsulation substrate. Accordingly, the second substrate 105 may serve to prevent a decrease in lifespan of the organic light emitting diode OLED and luminance deterioration by preventing moisture and/or oxygen from being introduced into the organic light emitting diode OLED of the main pixel unit 102.

The first substrate 101 may include main gate lines MGL for forwarding the gate signal provided from the GIP unit 103 to the main pixel unit 102 and main data lines MDL for forwarding the data voltage provided from the source drive IC 120 to the main pixel unit 102.

The second substrate 105 may include auxiliary gate lines AGL for forwarding the gate signal to the auxiliary pixels AP and auxiliary data lines ADL for forwarding the data voltage to the auxiliary pixels AP.

The display panel 100 may include conductive patterns CPN. The conductive pattern CPN may include a first conductive pattern CPN1 for forwarding the gate signal provided from the GIP unit 103 to the auxiliary gate lines AGL.

The first conductive pattern CPN1 may electrically connect the main gate line MGL of the first substrate 101 and the auxiliary gate line AGL of the second substrate 105. That is, one end of the first conductive pattern CPN1 may be connected to the main gate line MGL of the first substrate 101 and the other end may be connected to the auxiliary gate line AGL of the second substrate 105. As a result, the main pixels MP of the main pixel unit 102 and the auxiliary pixels AP of the auxiliary pixel unit 106 arranged in the same row may be supplied with the gate signals of the same sequence number from the GIP unit 103. When differently expressed, the gate signals of the same sequence number may be applied to the main gate line MGL and the auxiliary gate line AGL arranged in the same row.

The conductive pattern CPN may include a second conductive pattern CPN2 for forwarding the data voltage provided from the source drive IC 120 to the auxiliary data lines ADL. The first substrate 101 may include an auxiliary routing line ARL for forwarding the data voltage from the pad unit 104 connected to the source drive IC 120. One end of the second conductive pattern CPN2 may be connected to the auxiliary routing line ARL of the first substrate 101 and the other end may be connected to the auxiliary data line ADL of the second substrate 105.

FIG. 11 is a diagram illustrating a transmission path example of a gate signal corresponding to FIGS. 9 and 10.

Referring to FIGS. 4, 6, 9, and 11, the first conductive pattern CPN1 may include a 1-1-st conductive pattern CPN1-1 formed on the first substrate 101 and a 1-2-nd conductive pattern CPN1-2 formed on the second substrate 105.

The main gate line MGL may be formed on the same layer as the main gate electrode MG of the main transistor MT. The 1-1-st conductive pattern CPN1-1 may be disposed on the surface of an uppermost portion of the first substrate 101, and connected to the main gate line MGL through a 1-1-st open hole OH1-1 penetrating the insulating layers interposed between the 1-1-st conductive pattern CPN1-1 and the main gate line MGL. The insulating layer interposed between the 1-1-st conductive pattern CPN1-1 and the main gate line MGL may be at least any one of the main gate insulator MGI, the protective film MPS, a planarization film MPN, and a bank layer BN.

The auxiliary gate line AGL may be formed on the same layer as the auxiliary gate electrode AG of the auxiliary transistor AT. The 1-2-nd conductive pattern CPN1-2 may be disposed on the surface of the uppermost portion of the second substrate 105, and connected to the auxiliary gate line AGL through a 1-2-nd open hole OH1-2 penetrating the insulating layers interposed between the 1-2-nd conductive pattern CPN1-2 and the auxiliary gate line AGL. The insulating layer interposed between the 1-2-nd conductive pattern CPN1-2 and the auxiliary gate line AGL may be at least any one of the auxiliary gate insulator AGI, the protective film APS, and the advanced planarization film APN.

As the 1-1-st conductive pattern CPN1-1 and the 1-2-nd conductive pattern CPN1-2 contact, the main gate line MGL on the first substrate 101 and the auxiliary gate line AGL on the second substrate 105 may be electrically connected.

As illustrated in FIG. 11(a), a 1-1-st spacer SP1-1 may be formed on the insulating layers of the first substrate 101 so as to facilitate a connection between the 1-1-st conductive pattern CPN1-1 and the 1-2-nd conductive pattern CPN1-2. The 1-1-st spacer SP1-1 may be formed to have a predetermined height, and the 1-1-st conductive pattern CPN1-1 may be extended to cover the surface of the 1-1-st spacer SP1-1. The 1-1-st conductive pattern CPN1-1 on the 1-1-st spacer SP1-1 may contact the 1-2-nd conductive pattern CPN1-2.

As illustrated in FIG. 11(b), a 1-2-nd spacer SP1-2 may be formed on the insulating layers of the second substrate 105 so as to facilitate a connection between the 1-1-st conductive pattern CPN1-1 and the 1-2-nd conductive pattern CPN1-2. The 1-2-nd spacer SP1-2 may be formed to have a predetermined height, and the 1-2-nd conductive pattern CPN1-2 may be extended to cover the surface of the 1-2-nd spacer SP1-2. The 1-2-nd conductive pattern CPN1-2 on the 1-2-nd spacer SP1-2 may contact the 1-1-st conductive pattern CPN1-1.

Although not illustrated, a first spacer SP1 may include both a 1-1-st spacer SP1-1 and a 1-2-nd spacer SP1-2. The 1-1-st conductive pattern CPN1-1 may be extended to cover the surface of the 1-1-st spacer SP1-1. The 1-2-nd conductive pattern CPN1-2 may be extended to cover the surface of the 1-2-nd spacer SP1-2. The 1-1-st conductive pattern CPN1-1 on the 1-1-st spacer SP1-1 may contact the 1-2-nd conductive pattern CPN1-2 on the 1-2-nd spacer SP1-2.

FIG. 12 is a diagram illustrating a transmission path example of a data signal corresponding to FIGS. 9 and 10.

Referring to FIGS. 4, 6, 9, and 12, the second conductive pattern CPN1 may include a 2-1-st conductive pattern CPN2-1 formed on the first substrate 101 and a 2-2-nd conductive pattern CPN2-2 formed on the second substrate 105.

The auxiliary routing line ARL may be formed on the same layer as the main source/drain electrode MS/MD of the main transistor MT. The 2-1-st conductive pattern CPN2-1 may be disposed on the surface of the uppermost portion of the first substrate 101, and connected to the auxiliary routing line ARL through a 2-1-st open hole OH2-1 penetrating the insulating layers interposed between the 2-1-st conductive pattern CPN2-1 and the auxiliary routing line ARL. The insulating layer interposed between the 2-1-st conductive pattern CPN2-1 and the auxiliary routing line ARL may be at least any one of the protective film MPS, the planarization film MPN, and the bank layer BN.

The auxiliary data line ADL may be formed on the same layer as the auxiliary source/drain electrode AS/AD of the auxiliary transistor AT. The 2-2-nd conductive pattern CPN2-2 may be disposed on the surface of the uppermost portion of the second substrate 105, and connected to the auxiliary data line ADL through a 2-2-nd open hole OH2-2 penetrating the insulating layers interposed between the 2-2-nd conductive pattern CPN2-2 and the auxiliary data line ADL. The insulating layer interposed between the 2-2-nd conductive pattern CPN2-2 and the auxiliary data line ADL may be the protective film APS and the advanced planarization film APN.

As the 2-1-st conductive pattern CPN2-1 and the 2-2-nd conductive pattern CPN2-2 contact, the auxiliary routing line ARL on the first substrate 101 and the auxiliary data line ADL on the second substrate 105 may be electrically connected.

As illustrated in FIG. 12(a), a 2-1-st spacer SP2-1 may be formed on the insulating layers of the first substrate 101 so as to facilitate a connection between the 2-1-st conductive pattern CPN2-1 and the 2-2-nd conductive pattern CPN2-2. The 2-1-st spacer SP1-1 may be formed to have a predetermined height, and the 2-1-st conductive pattern CPN2-1 may be extended to cover the surface of the 2-1-st spacer SP2-1. The 2-1-st conductive pattern CPN2-1 on the 2-1-st spacer SP2-1 may contact the 2-2-nd conductive pattern CPN2-2.

As illustrated in FIG. 12(b), a 2-2-nd spacer SP2-2 may be formed on the insulating layers of the second substrate 105 so as to facilitate a connection between the 2-1-st conductive pattern CPN2-1 and the 2-2-nd conductive pattern CPN2-2. The 2-2-nd spacer SP1-2 may be formed to have a predetermined height, and the 2-2-nd conductive pattern CPN2-2 may be extended to cover the surface of the 2-2-nd spacer SP2-2. The 2-2-nd conductive pattern CPN2-2 on the 2-2-nd spacer SP2-2 may contact the 2-1-st conductive pattern CPN2-1.

Although not illustrated, a second spacer SP2 may include both a 2-1-st spacer SP2-1 and a 2-2-nd spacer SP2-2. The 2-1-st conductive pattern CPN2-1 may be extended to cover the surface of the 2-1-st spacer SP2-1. The 2-2-nd conductive pattern CPN2-2 may be extended to cover the surface of the 2-2-nd spacer SP2-2. The 2-1-st conductive pattern CPN2-1 on the 2-1-st spacer SP2-1 may contact the 2-2-nd conductive pattern CPN2-2 on the 2-2-nd spacer SP2-2.

FIG. 13 is a diagram illustrating an application example of a display device according to the present disclosure.

A display device according to an embodiment of the present disclosure may be used as a relatively small display device such as a TV, a monitor, and various personal portable digital devices, and also used as a relatively large display device such as a public display and a digital signage.

The large display device may be generally disposed outdoors and used as for a usage for providing information to multiple users. Accordingly, the large display device needs to be implemented in a large area so as for users to easily view the information provided from the display device even at a remote distance.

However, in spite of the development of manufacturing technology, an area of the display device which can be manufactured by using one base substrate is limited at present. That is, when the display panel constituting the large display device is manufactured by using one base substrate, it is difficult to ensure a yield of a predetermined level or higher.

In order to solve the above-described problem, proposed is a method for implementing a large-area display device by combining a plurality of display panels having a largest area which can be manufactured by current stable technology is combined. For example, four display panels 100 provided as illustrated in FIG. 13 are arranged on a horizontal surface in line, and neighboring display panels 100 are mutually fixed to implement the large di splay device. The display device implemented by such a method may be referred to as a tiling display device.

In the case of a conventional tiling display device, since a plurality of divided display panels 100 has a mutually combined form, a seam is present among the neighboring display panels 100. Since the seam corresponds to a bezel area in which the image is not implemented, a sense of alienation and/or a sense of difference are/is given to a user who views the tiling display device, thereby remarkably decreasing an image immersion sense.

Unlike this, since the display panel 100 according to the present disclosure can remarkably reduce the bezel area, an awareness level of the seam may be remarkably reduced in the case of the tiling display device adopting the display panel 100. Accordingly, the tiling display device adopting the display panel 100 of the present disclosure has an advantage of being capable of providing superior visual information and maximizing the immersion of the user.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising:
a display panel having a first display area and a second display area outside of the first display area,
wherein the display panel includes:
a first substrate which includes a main pixel unit disposed in the first display area and having main pixels, and a gate in panel (GIP) unit disposed in the second display area and configured to generate a gate signal; and
a second substrate which is bonded to the first substrate, and includes an auxiliary pixel unit disposed in the second display area and having auxiliary pixels,
wherein the GIP unit is further configured to supply the gate signal to the main pixels and the auxiliary pixels,
wherein the auxiliary pixel unit overlaps with the GIP unit,
wherein the main pixels include a main transistor and an organic light emitting diode connected to the main transistor, and
wherein the auxiliary pixels include an auxiliary transistor and an inorganic light emitting diode connected to the auxiliary transistor.

2. The display device of claim 1, wherein pixels on a same row among the main pixels and the auxiliary pixels are applied with the gate signal of a same sequence number.

3. The display device of claim 1, wherein the main pixel unit and the GIP unit are disposed on a rear surface of the first substrate, and
the auxiliary pixel unit is disposed on a rear surface of the second substrate, the first substrate further includes first routing lines connected to the GIP unit, and extended to one end of the first substrate, and the second substrate further includes auxiliary gate lines connected to the auxiliary pixel unit, and extended to one end of the second substrate, and a first routing line of the first routing lines and an auxiliary gate line of the auxiliary gate lines are electrically connected through a first link line extended while surrounding a circumference of the one end of the first substrate.

4. The display device of claim 1, wherein the main pixel unit and the GIP unit are disposed on a front surface of the first substrate, and the auxiliary pixel unit is disposed on a rear surface of the second substrate, the first substrate further includes a main gate line to forward the gate signal by connecting the GIP unit and the main pixel unit, and the second substrate further includes an auxiliary gate line connected to the auxiliary pixel unit to forward the gate signal to the auxiliary pixel unit, and the main gate line and the auxiliary gate line are electrically connected through a first conductive pattern disposed between the first substrate and the second substrate.

5. The display device of claim 4, wherein the main gate line and the auxiliary gate line arranged on a same row are applied with the gate signal of a same sequence number.

6. The display device of claim 4, wherein the display panel further includes a pad unit disposed on the front surface of the first substrate, the first substrate further includes auxiliary routing lines connected to the pad unit, the second substrate further includes auxiliary data lines connected to the auxiliary pixel unit to forward data voltage to the auxiliary pixel unit, and an auxiliary routing line of the auxiliary routing lines and an auxiliary data line of the auxiliary data lines are electrically connected through a second conductive pattern disposed between the first substrate and the second substrate.

7. The display device of claim 6, wherein the first conductive pattern includes a 1-1-st conductive pattern on the first substrate and a 1-2-nd conductive pattern on the second substrate, the 1-1-st conductive pattern is connected to the main gate line through a 1-1-st open hole penetrating at least one first insulating layer disposed between the main gate line and the 1-1-st conductive pattern, the 1-2-nd conductive pattern is connected to the auxiliary gate line through a 1-2-nd open hole penetrating at least one second insulating layer disposed between the auxiliary gate line and the 1-2-nd conductive pattern, and the 1-1-st conductive pattern and the 1-2-nd conductive pattern are connected.

8. The display device of claim 6, wherein the second conductive pattern includes a 2-1-st conductive pattern on the first substrate and a 1-2-nd 2-2-nd conductive pattern on the second substrate, the 2-1-st conductive pattern is connected to the auxiliary routing line through a 2-1-st open hole penetrating at least one third insulating layer disposed between the auxiliary routing line and the 2-1-st conductive pattern, and the 2-2-nd conductive pattern is connected to the auxiliary data line through a 2-2-nd open hole penetrating at least one fourth insulating layer disposed between the auxiliary data line and the 2-2-nd conductive pattern, and the 2-1-st conductive pattern and the 2-2-nd conductive pattern are connected.

9. The display device of claim 8, wherein the first substrate further includes a 2-1-st spacer disposed on the at least one third insulating layer, and the first 2-1-st conductive pattern is extended to cover a surface of the 2-1-st spacer.

10. The display device of claim 8, wherein the second substrate further includes a 2-2-nd spacer disposed on the at least one fourth insulating layer, and the 2-2-nd conductive pattern is extended to cover a surface of the 2-2-nd spacer.

11. A display device comprising:

a display panel having a first display area and a second display area outside of the first display area, wherein the display panel includes:

a first substrate which includes a main pixel unit disposed in the first display area and having main pixels, and a gate in panel (GIP) unit disposed in the second display area and configured to generate a gate signal; and a second substrate which is bonded to the first substrate, and includes an auxiliary pixel unit disposed in the second display area and having auxiliary pixels, wherein the GIP unit is further configured to supply the gate signal to the main pixels and the auxiliary pixels, wherein the main pixel unit and the GIP unit are disposed on a rear surface of the first substrate, wherein the auxiliary pixel unit is disposed on a rear surface of the second substrate, wherein the first substrate further includes first routing lines connected to the GIP unit, and extended to one end of the first substrate, wherein the second substrate further includes auxiliary gate lines connected to the auxiliary pixel unit, and extended to one end of the second substrate, and wherein a first routing line of the first routing lines and an auxiliary gate line of the auxiliary gate lines are electrically connected through a first link line extended while surrounding a circumference of the one end of the first substrate.

12. The display device of claim 11, wherein the display panel further includes a pad unit disposed on the rear surface of the first substrate, the first substrate further includes second routing lines connected to the pad unit, and extended to another end of the first substrate, and the second substrate further includes auxiliary data lines connected to the auxiliary pixel unit to forward data voltage to the auxiliary pixel unit, and extended to another end of the second substrate, and a second routing line of the second routing lines and an auxiliary data line of the auxiliary data lines are electrically connected through a second link line extended while surrounding a circumference of the other end of the first substrate.

13. The display device of claim 11, wherein the first substrate further includes main gate lines to forward the gate signal by connecting the GIP unit and the main pixel unit, and a main gate line of the main gate lines and an auxiliary gate line of the auxiliary gate lines arranged on a same row are applied with the gate signal of a same sequence number.

14. The display device of claim 11, further comprising:
an encapsulation layer disposed on the rear surface of the first substrate and disposed to cover the main pixel unit,
wherein the encapsulation layer includes a metallic material.

15. A display device comprising:
a display panel having a first display area and a second display area outside of the first display area,
wherein the display panel includes:
a first substrate which includes a main pixel unit disposed in the first display area and having main pixels, and a gate in panel (GIP) unit disposed in the second display area and configured to generate a gate signal; and
a second substrate which is bonded to the first substrate, and includes an auxiliary pixel unit disposed in the second display area and having auxiliary pixels,
wherein the GIP unit is further configured to supply the gate signal to the main pixels and the auxiliary pixels,
wherein the main pixel unit and the GIP unit are disposed on a front surface of the first substrate,
wherein the auxiliary pixel unit is disposed on a rear surface of the second substrate,
wherein the first substrate further includes a main gate line to forward the gate signal by connecting the GIP unit and the main pixel unit,
wherein the second substrate further includes an auxiliary gate line connected to the auxiliary pixel unit to forward the gate signal to the auxiliary pixel unit,
wherein the main gate line and the auxiliary gate line are electrically connected through a first conductive pattern disposed between the first substrate and the second substrate,
wherein the display panel further includes a pad unit disposed on the front surface of the first substrate,
wherein the first substrate further includes auxiliary routing lines connected to the pad unit,
wherein the second substrate further includes auxiliary data lines connected to the auxiliary pixel unit to forward data voltage to the auxiliary pixel unit,
wherein an auxiliary routing line of the auxiliary routing lines and an auxiliary data line of the auxiliary data lines are electrically connected through a second conductive pattern disposed between the first substrate and the second substrate,
wherein the first conductive pattern includes a 1-1-st conductive pattern on the first substrate and a 1-2-nd conductive pattern on the second substrate,
wherein the 1-1-st conductive pattern is connected to the main gate line through a 1-1-st open hole penetrating at least one first insulating layer disposed between the main gate line and the 1-1-st conductive pattern,
wherein the 1-2-nd conductive pattern is connected to the auxiliary gate line through a 1-2-nd open hole penetrating at least one second insulating layer disposed between the auxiliary gate line and the 1-2-nd conductive pattern, and
wherein the 1-1-st conductive pattern and the 1-2-nd conductive pattern are connected.

16. The display device of claim 15, wherein the first substrate further includes a 1-1-st spacer disposed on the at least one first insulating layer, and
the 1-1-st conductive pattern is extended to cover a surface of the 1-1-st spacer.

17. The display device of claim 15, wherein the second substrate further includes a 1-2-nd spacer disposed on the at least one second insulating layer, and
the 1-2-nd conductive pattern is extended to cover a surface of the 1-2-nd spacer.

* * * * *